United States Patent
Baumgartner et al.

(10) Patent No.: US 6,745,377 B2
(45) Date of Patent: Jun. 1, 2004

(54) APPARATUS AND METHOD FOR REPRESENTING GATED-CLOCK LATCHES FOR PHASE ABSTRACTION

(75) Inventors: Jason Raymond Baumgartner, Austin, TX (US); Robert Lowell Kanzelman, Rochester, MN (US); Wolfgang Roesner, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 10/116,584

(22) Filed: Apr. 4, 2002

(65) Prior Publication Data

US 2003/0192017 A1 Oct. 9, 2003

(51) Int. Cl.$^7$ .............................................. G06F 17/50
(52) U.S. Cl. ..................... 716/6; 716/3; 716/7; 716/2; 703/16
(58) Field of Search ............................. 716/6, 3, 7, 2; 703/16

(56) References Cited

U.S. PATENT DOCUMENTS

| | | | | |
|---|---|---|---|---|
| 5,649,176 A | * | 7/1997 | Selvidge et al. | 713/400 |
| 5,734,572 A | * | 3/1998 | Guignet | 700/97 |
| 6,321,184 B1 | | 11/2001 | Baumgartner et al. | 703/15 |
| 6,389,374 B1 | * | 5/2002 | Jain et al. | 703/2 |
| 6,434,704 B1 | * | 8/2002 | Dean et al. | 713/320 |
| 6,643,829 B1 | * | 11/2003 | Borkovic et al. | 716/3 |

(List continued on next page.)

OTHER PUBLICATIONS

Hasteer et al., "Efficient Equivalence Checking of Multi-phase Designs using Retiming", 1998 IEEE/ACM International Conference on Computer–Aided Design, Nov. 8, 1998, pp. 557–562.*

(List continued on next page.)

*Primary Examiner*—Matthew Smith
*Assistant Examiner*—Phallaka Kik
(74) *Attorney, Agent, or Firm*—Duke W. Yee; Casimer K. Salys; Stephen J. Walder, Jr.

(57) ABSTRACT

An apparatus and method for automated use of phase abstraction for enhanced verification of circuit designs is provided. With the apparatus and method, latches are "colored," i.e. classified into different types, based on information obtained from a clock tree of the circuit design. Clock tree primitives contain sufficient information to taxonomize the clocks into their respective phases and identify which latches are gated latches. In coloring the latches, gated latches are replaced in the circuit design with a free running clock, a multiplexor, and a sequence of L1 to Ln latches to provide a feedback path via the data path. This allows the gated latch to be phase abstracted without losing the "gated" functionality of the gated latch in the resulting trace. Once the latches are colored in this way, phase abstraction is performed on the colored circuit design. The phase abstracted netlist is then subjected to verification and a trace is produced. The coloring information of the original circuit, plus information as to the exact nature of the phase abstraction performed, is then used to transform the phase abstracted trace to one which resembles a trace of the circuit without phase abstraction.

29 Claims, 6 Drawing Sheets

U.S. PATENT DOCUMENTS

2003/0084414 A1 * 5/2003 Beletsky ......................... 716/4
2003/0121013 A1 * 6/2003 Moon et al. .................... 716/6
2003/0192016 A1 * 10/2003 Baumgartner et al. ......... 716/4
2003/0192018 A1 * 10/2003 Baumgartner et al. ......... 716/5

OTHER PUBLICATIONS

BenHamida et al., "High Level Synthesis with Testability Constraints", 1994 IEEE International Symposium on Circuits and Systems, vol. 1, May 30, 1994, pp. 65–68.*

Champernowne et al., "Latch–to–Latch Timing Rules", IEEE Transactions on Computers, vol. 39, No.6, Jun. 1990, pp. 798–80.*

Baumgartner et al., "Model Checking the IBM Gigahertz Processor: An Abstraction Algorithm for High–Performance Netlists", pp. 1–12, no date.

Hasteer et al., "Efficient Equivalence Checking of Multi–Phase Designs Using Phase Abstraction and Retiming", ACM Transactions on Design Automation of Electronic Systems, vol. 3, No. 4, Oct. 1998, pp. 600–625.

Baumgartner et al., Apparatus and Method for Automated Use of Phase Abstraction for Enhanced Verification of Circuit Designs, Apr. 4, 2002.

Baumgartner et al., Apparatus and Method for Removing Effects of Phase Abstraction from a Phase Abstraction Trace, Apr. 4, 2002.

* cited by examiner

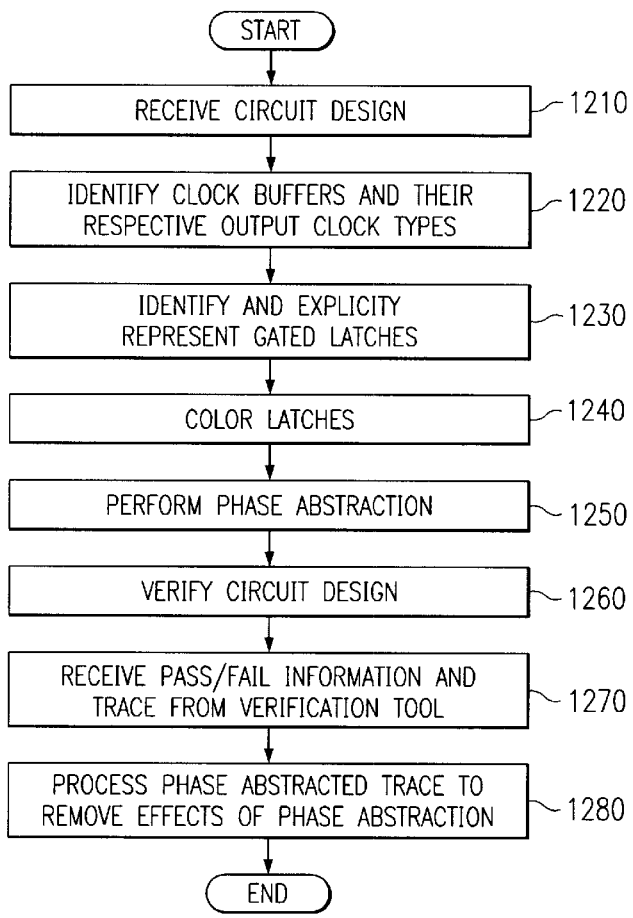
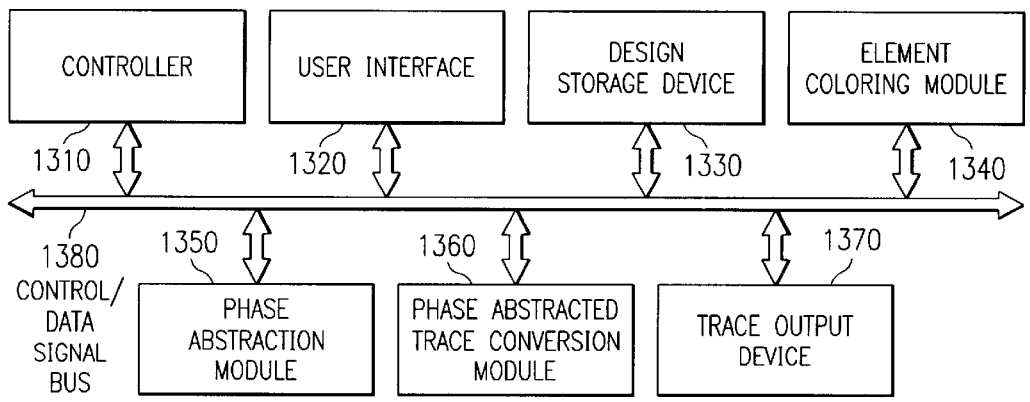

APPARATUS AND METHOD FOR REPRESENTING GATED-CLOCK LATCHES FOR PHASE ABSTRACTION

RELATED APPLICATIONS

The present application is directed to similar subject matter as co-pending and commonly assigned U.S. patent application Ser. No. 10/116,607, now U.S. Patent Application Publication No. US 2003/0192018 A1, entitled "Apparatus and Method for Automated Use of Phase Abstraction for Enhanced Verification of Circuit Designs" and U.S. patent application Ser. No. 10/116,583, now U.S. Patent Application Publication No. US 2003/0192016 A1, entitled "Apparatus and Method for Removing Effects of Phase Abstraction from a Phase Abstracted Trace," both filed concurrently herewith and incorporated by reference.

BACKGROUND OF THE INVENTION

1. Technical Field

The present invention is directed to an apparatus and method for automated use of phase abstraction for enhanced verification of circuit designs.

2. Description of Related Art

Functional hardware verification is the process of demonstrating the correct behavior of a hardware design. Typically, the verification is performed on a "software" model of the design, e.g., the hardware description language (HDL), or a netlist representation derived through compilation of the HDL or custom design (or some other "compiled" format), which is executed on a computer or downloaded onto a hardware emulator. A trace of the "software" model is generated by a verification tool and may be used to expose any problems in the software model or provide an output to a human user that may use the trace to evaluate the correctness of the design during operation.

A trace may be, for example, an "all events trace" that illustrates 0, 1 valuations to each gate of a software model over time. Such traces can be created by simulation tools evaluating the software model in response to a test case, e.g., sequences of 0, 1 values of the input to the software model over time, or by formal verification algorithms which are commonly referred to as "counterexample traces."

The size of the design under test represents a significant bottleneck for the necessary verification resources. For simulation and emulation test-based techniques, the required resources are nearly linear with respect to design size. The drawback of such test-based techniques is that they are incomplete, and cannot prove the absence of design flaws, only their presence. Consequently there has been a peak of interest in formal verification techniques, which can prove the absence as well as presence of design flaws. However, such techniques consume exponential verification resources with respect to design size. In particular, verification resources typically run exponential with respect to the number of sequential elements (e.g., latches or registers) in the design. Combinational optimization techniques, prevalent in both test-based and formal verification paradigms, are capable of significantly reducing design size, but are limited in applicability to only the logic between sequential element boundaries. Thus sequential elements limit the ability of combinational model reduction techniques to simplify designs for verification regardless of the verification paradigm.

One technique, known as phase abstraction, has been developed to help minimize the number of sequential elements in a design under test. The use of phase abstraction for enhanced verification has been noted in several publications including "Efficient Equivalence Checking of Multi-Phase Designs Using Phase Abstraction and Retiming," G. Hasteer, A. Mathur, and P. Banerjee, in Proceedings of the High-Level Design Validation and Test Symposium 1997 (which focusses on sequential hardware equivalence checking) and "Model Checking the IBM Gigahertz Processor: An Abstraction Algorithm for High-Performance Netlists," J. Baumgartner, T. Heyman, V. Singhal, and A. Aziz, in Proceedings of the Conference on Computer-Aided Verification 1999 (which focusses on functional verification), which are hereby incorporated by reference. In addition, a specific technique for performing phase abstraction is described in commonly assigned U.S. Pat. No. 6,321,184, which is also hereby incorporated by reference. In particular, for a design composed of level-sensitive latches, phase abstraction converts all but one "class" of latches to wires based on the fact that the latches are transparent when they are clocked. The remaining class of latches is converted to registers, thereby significantly reducing the number of sequential elements by at least a factor of "k" for a "k"-phase design.

The impact of this technique on increasing the power of combinational optimization techniques, and on increasing the speed with which verification algorithms operate (basically linear for test-based techniques, and exponential for formal verification techniques), has been previously noted above. However, this technique has several complications and unpleasant side effects.

First, one must provide the glue to partition the latches into various classes. In other words, the user of the phase abstraction technique must identify which latches are of a particular type in order for the phase abstraction to work. Thus, an additional burden is placed on the user of the phase abstraction technique. Moreover, if the determination of latch type is incorrect, verification of the phase abstracted netlist becomes unsound, i.e. the verification results obtained on the phase abstracted netlist may not imply anything about correctness of the original netlist.

Second, design techniques such as gated-clock latches provide complications for these techniques. During phase abstraction, if a gated clock latch is replaced by a wire, the resulting trace includes errors due to the fact that the latch is not always transparent during the latch's clocking at which it is normally transparent. This is because a gate signal may be used to alter the operation of the latch during this clocking. In particular, the global clock of the netlist can be selectively stopped for gated-clock latches by ANDing this global clock with a gate signal before driving it to these latches. As a result, if phase abstraction eliminates such latches, their gated behavior is destroyed, i.e. when their gates "close" they will still appear to behave as if their gates were "open." Thus, phase abstraction in the presence of gated-clock latches also risks making the transformation unsound for verification purposes.

Third, any simulation-style of traces obtained on a phase abstracted design will be in terms of the phase-abstracted model itself, which may be unattractive to those who expect a trace in terms of the original model. It may be difficult and time consuming for the human user of the phase abstraction technique to convert the trace obtained through phase abstraction into a corresponding trace that would have been obtained without the phase abstraction.

Thus, it would be beneficial to have an apparatus and method for eliminating these three unattractive side-effects and/or complications of phase abstraction and thereby, provide a truly seamless or "invisible" automatic use of phase abstraction for enhanced verification.

SUMMARY OF THE INVENTION

The present invention provides an apparatus and method for automated use of phase abstraction for enhanced verification of circuit designs. With the apparatus and method of the present invention latches are "colored," i.e. classified into different types, based on information obtained from a clock tree of the circuit design. In the clock tree, clock tree primitives drive all clock signals to the latches. These clock tree primitives contain sufficient information to taxonomize the clocks into their respective phases. This information may further be used to identify which latches are gated latches.

In coloring the latches, in a preferred embodiment, gated latches are replaced in the circuit design with a free running clock, a multiplexor, and a sequence of L1 to Ln latches to provide a feedback path via the data path. This allows the gated latch to be phase abstracted without losing the "gated" functionality of the gated latch in the resulting trace.

Once the latches are colored in this way, phase abstraction is performed on the colored circuit design. The phase abstracted netlist is then subjected to verification, e.g., simulation, or formal verification. As a result of the verification, a trace may be produced. This trace will be in terms of the phase abstracted circuit, since verification was performed upon the phase abstracted circuit. The coloring information of the original circuit, plus information as to the exact nature of the phase abstraction performed, is then used to transform the phase abstracted trace to one which resembles a trace of the circuit without phase abstraction.

To undo the effects of phase abstraction in the trace, a list of all signal names of each "color" is generated. In other words, all nets are colored such that all nets combinationally driven by latches of color "i" also have color "i"; all nets combinationally driving data_in of latches of color "i" have color "(i−1) mod k"; all nets in combinational cones of color "i" also have color "i"; and all non-clock nets not colored by the above are defaulted to color "0". Having colored the nets and generated a listing of all signals, the effects of the phase abstraction are removed from the phase-abstracted trace by propagating only signals appearing in the "color_i" list, i.e. clock tree signals are eliminated; and for a color "j" signal, the value present in the phase-abstracted trace at time "i" will be replicated at times "k*i−j" through "k*(i+1)−j−1." Note that "j" ranges from 0 to k−1.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 12 is a flowchart outlining an exemplary operation of the present invention for automatically performing coloring of latches in a circuit design, performing phase abstraction, and generating a trace in which phase abstraction effects are removed; and FIG. 13 is an exemplary block diagram of an apparatus for performing the functions of the present invention.

DETAILED DESCRIPTION OF THE PREFERRED EMBODIMENT

Figure 1:
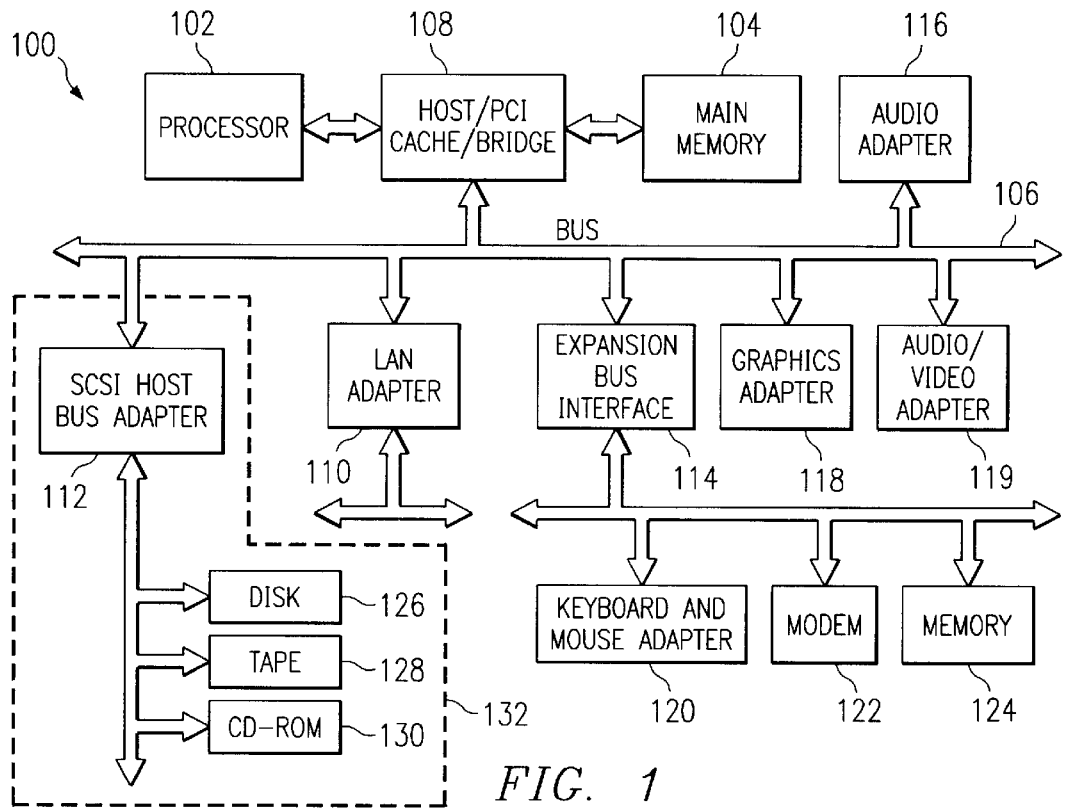
FIG. 1 is an exemplary block diagram of a computing apparatus according to the present invention.

With reference now to the figures, and in particular FIG. 1, a block diagram illustrating a data processing system is depicted in which the present invention may be implemented. Data processing system 100 is an example of a client computer. Data processing system 100 employs a peripheral component interconnect (PCI) local bus architecture. Although the depicted example employs a PCI bus, other bus architectures such as Accelerated Graphics Port (AGP) and Industry Standard Architecture (ISA) may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter 119 are connected to PCI local bus 106 by add-in boards inserted into expansion slots. Expansion bus interface 114 provides a connection for a keyboard and mouse adapter 120, modem 122, and additional memory 124. Small computer system interface (SCSI) host bus adapter 112 provides a connection for hard disk drive 126, tape drive 128, and CD-ROM drive 130. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system, such as Windows 2000, which is available from Microsoft Corporation. An object oriented programming system such as Java may run in conjunction with the operating system and provide calls to the operating system from Java programs or applications executing on data processing system 100. "Java" is a trademark of Sun Microsystems, Inc. Instructions for the operating system, the object-oriented operating system, and applications or programs are located on storage devices, such as hard disk drive 126, and may be loaded into main memory 104 for execution by processor 102.

Those of ordinary skill in the art will appreciate that the hardware in FIG. 1 may vary depending on the implementation. Other internal hardware or peripheral devices, such as flash ROM (or equivalent nonvolatile memory) or optical disk drives and the like, may be used in addition to or in place of the hardware depicted in FIG. 1. Also, the processes of the present invention may be applied to a multiprocessor data processing system.

As another example, data processing system 100 may be a stand-alone system configured to be bootable without relying on some type of network communication interface, whether or not data processing system 100 comprises some type of network communication interface. As a further example, data processing system 100 may be a personal digital assistant (PDA) device, which is configured with ROM and/or flash ROM in order to provide nonvolatile memory for storing operating system files and/or user-generated data.

The depicted example in FIG. 1 and above-described examples are not meant to imply architectural limitations. For example, data processing system 100 also may be a notebook computer or hand held computer in addition to taking the form of a PDA. Data processing system 100 also may be a kiosk or a Web appliance.

Figure 2:
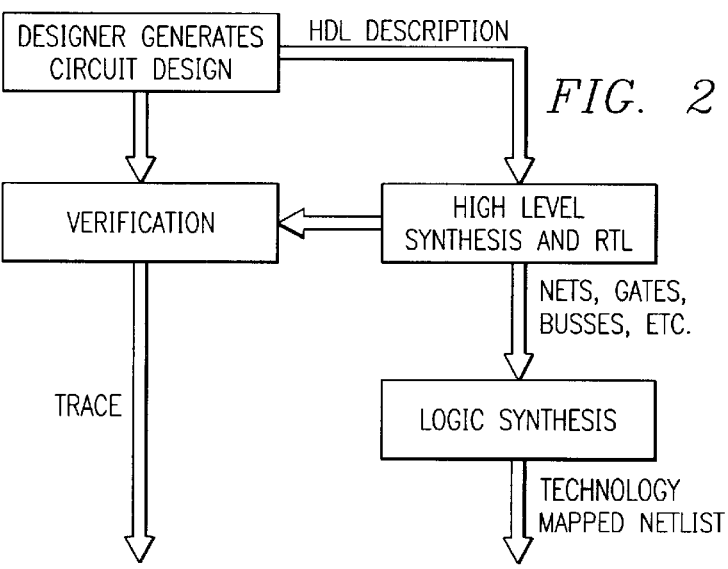
FIG. 2 is an exemplary diagram illustrating a process of verification of a circuit design.

FIG. 2 illustrates the process involved in generating and verifying a hardware circuit design. As shown in FIG. 2, the process starts with a hardware designer generating a hardware description of the circuit design. This hardware description may be written, for example, using a hardware description language (HDL). High-level synthesis and register-transfer-level (RTL) synthesis are then performed on the HDL description to thereby generate a description of a network of nets, gates, busses, multi-bit boxes (e.g., adders, registers) corresponding to the HDL description, in a particular format. Logic synthesis takes this network description, optimizes it, and produces a technology mapped netlist of the circuit design which is then used to fabricate the circuit.

Verification is the process of verifying the operation of the circuit model. Verification may be performed on the HDL description of the circuit design or on the network description. Verification may produce a trace illustrating the operation of the circuit design. This trace may be manually or automatically parsed to assess if the circuit behaved properly or improperly along that trace. Phase abstraction may be performed to reduce the workload in performing the verification.

The present invention provides an apparatus and method for improving the operation of phase abstraction. The present invention improves phase abstraction by providing automated apparatus and methods for coloring latches in a circuit design, handling gated latches, and removing the effects of phase abstraction on resulting traces. As a result, an accurate trace of the circuit design is obtained in which the use of phase abstraction is not perceivable in the resulting trace.

In explaining how the present invention operates to improve the operation of phase abstraction, consider a k-phase level-sensitive latch-based design that is composed of combinational logic and level-sensitive latches. A level-sensitive latch is a device which has 2 inputs, data and clock, and one data output. A level-sensitive latch acts as a wire when its clock is active (i.e., when it is "transparent"), and holds its last-output value when the clock is inactive. For purposes of the present description, it will be assumed, without loss of generality, that the clock is active when it is a logical one.

An initial value is defined for the latches in the circuit design to define their output values at time 0 if their clocks are inactive. A correct level-sensitive latch-based design is one whose latches can be classified into k classes as follows: latches of class "c" can only transitively (i.e., without passing through another latch) fan out to latches of class "(c+1) mod k"; the clock to each latch is active every k'th time-step; the clocks to latch class 0 are active at time 0; and if clocks to latch class "c" are active at time "i", then clocks to class "(c+1) mod k" are active at time "i+1". Note that in such designs, functional signals only "toggle" at most every k time-steps due to the clocking.

Phase abstraction consists of making all but one class of latches into wires, and transforming the remaining class into registers which implicitly update values at each time-step, i.e. they become unconditional one-cycle delay elements. By doing such, time is folded modulo k when verifying this design (ordinarily k time-steps would be necessary for a logical value to propagate through all k classes of latches, but after phase abstraction only one time-step is necessary). Logic in the clock tree itself is eliminated because it is no longer necessary, and its semantics are destroyed by phase abstraction.

As discussed above, phase abstraction can significantly reduce the number of latches in a design (by at least a factor of k, for a k-phase design) which in itself can provide a linear increase in the speed by which test-based techniques operate and an exponential increase in speed of formal verification techniques. Phase abstraction can further enable combinational optimizations which can arbitrarily further reduce model size.

There are several complications relating to the use of phase abstraction on real designs. First, the latches must be partitioned into classes, denoting in which "phase" of the clock they are transparent. Second, gated-clock latches pose a complication for phase abstraction because they cannot safely be transformed into wires without violating the semantics of the abstraction (i.e., a wire cannot hold values). Third, traces obtained from verification of phase-abstracted designs reflect the process of phase abstraction, e.g., the inputs and outputs of eliminated latches become simultaneous copies of each other, which can make viewing sequential traces difficult by the designer of the corresponding logic who expects traces to be in terms of the original design, not the phase abstracted variant. None of these topics are addressed by prior art phase abstraction techniques.

The present invention alleviates these three complications that come as a by-product of the use of phase abstraction by providing an automated mechanism for coloring latches in the circuit design, handling gated latches, and removing the effects of phase abstraction from the resulting trace of the phase abstraction. Each of these aspects of the present invention may be used with known phase abstraction techniques independently of the other aspects. For example, the automated mechanism for coloring latches may be used independently of the automated mechanism for handling gated latches and the automated mechanism for removing the effects of phase abstraction from a phase-abstracted trace.

In coloring latches in a circuit design, a clock tree is utilized to obtain information about the latches in the circuit design. A clock tree is a representation of the manner by which clock signals are distributed throughout the circuit logic in a circuit design. Clock trees and the manner by which clock trees are generated and described are generally known in the art and thus, a detailed explanation is not included herein.

Figure 3:
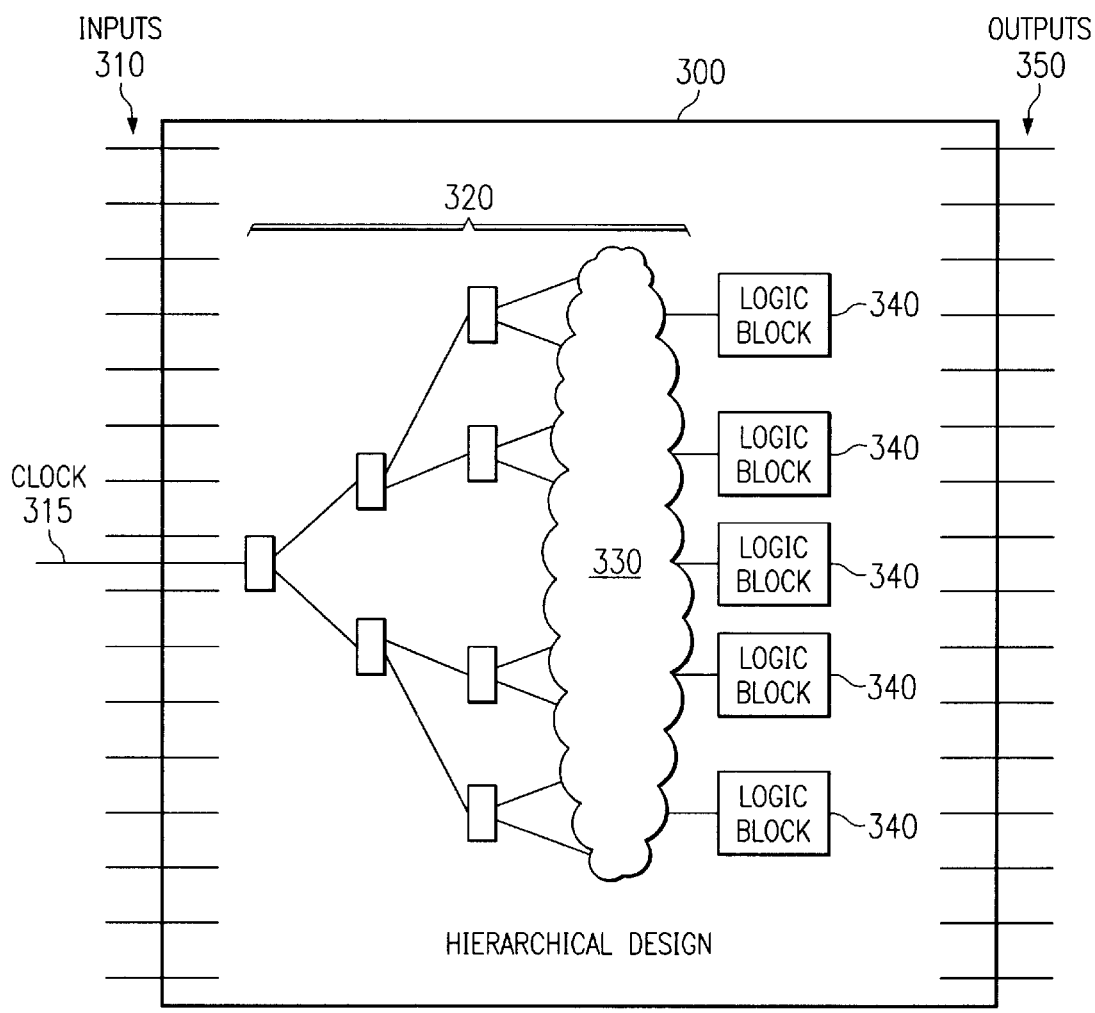
FIG. 3 is an exemplary diagram illustrating a clock tree from the level of a hierarchical design.

FIG. 3 is an exemplary diagram illustrating a clock tree for a hierarchical circuit design. As shown in FIG. 3, the hierarchical design 300 includes a plurality of inputs 310 and outputs 350. One of the many inputs is a clock signal 315. The clock signal 315 passes through clock buffer/ redistribution logic 320 to recreate many "balanced" copies of the clock signal. This is done to minimize circuit noise, delay and clock skew. This clock buffer/redistribution logic 320 may contain a numerous elements, of which only a few are depicted. The cloud 330 is depicted to illustrate other elements of the clock buffer/redistribution logic 320 which are explicitly shown.

Ultimately, the outputs of the clock buffer/redistribution logic 320 pass to logic blocks 340 at a lower level of the hierarchy. It is at this lower level of the hierarchy that the mechanisms of the present invention are applied for high-performance circuit designs. The same mechanisms of the present invention may be applied to the clock tree depicted in FIG. 3 for lower performance circuit designs without departing from the spirit and scope of the present invention.

It should be appreciated that the hierarchical view of a circuit design may be for an entire integrated circuit chip or any component thereof. In other words, each "child" of the chip level view may also be represented as a hierarchical design similar to that shown in FIG. 3. Thus, the present invention may be applied to any level of the circuit design.

Figure 4:
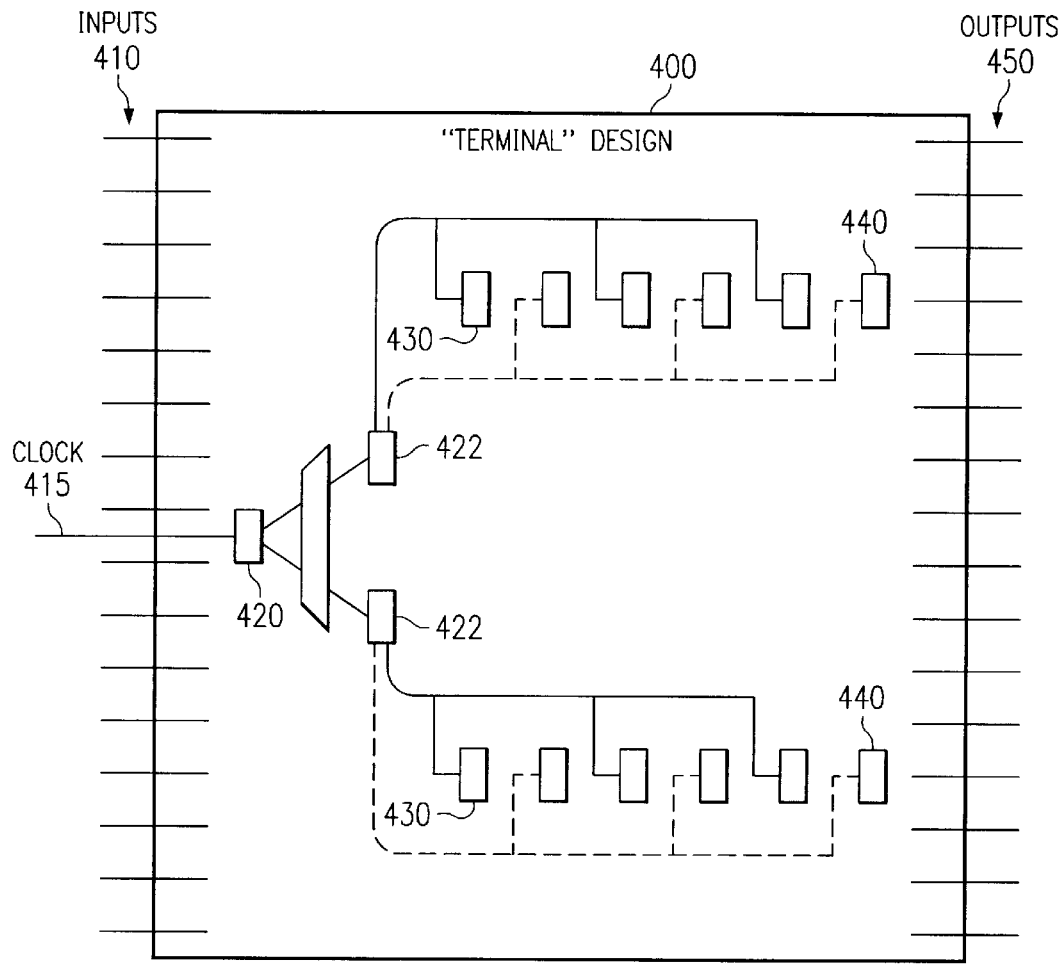
FIG. 4 is an exemplary diagram illustrating a "terminal" design at the logic blocks of FIG. 3.

FIG. 4 is an exemplary diagram illustrating a "terminal" design entity corresponding to logic blocks 340 in FIG. 3. While FIG. 4 is illustrated for a lower level of the hierarchical design in FIG. 3, the present invention is not limited to such. Rather, the "terminal" design is intended to merely represent the particular design on which the present invention is operating. This design may be at a level of the entire circuit, a terminal part of the circuit, or any portion or level in-between. In a preferred embodiment, the present invention operates on a terminal part of the circuit design and thus, the design shown in FIG. 4 is termed a "terminal" design entity.

As shown in FIG. 4, the terminal design 400 includes a plurality of inputs 410 and outputs 450 in a similar manner as with the hierarchical design shown in FIG. 3. Also similar to FIG. 3, the terminal design 400 has one clock input 415. Pre-defined clock tree primitives 420 drive all clock signals received on clock input 415 to the latches 430 and 440 themselves. These primitives 420 contain sufficient information to taxonomize the clocks into their respective phases (i.e., no logic is allowed between the clock tree primitives and the latches in these design styles). From this information, a simple combinational fanout sweep from the clock tree primitives 420 can be used to "color" latches into their respective classes.

In the terminal design, the clock tree passes through more complex clock buffers 422 that have two (or for k-phase designs "k") outputs. These outputs represent clock signals to the respective latches 430 and 440 themselves. Thus, for a two phase circuit design, there are two types of clock outputs from these clock buffers—L1 clock signals (illustrated as solid lines) and L2 clock signals (illustrated as dashed lines). An L1 clock signal can only drive an L1 latch (latches 430), and an L2 clock signal can only drive an L2 latch (latches 440). Thus, it is possible to infer a latch type or classification from the clock signals sent to that latch. In this way, the clock buffers 422 ensure that the clock signals to the latches themselves are correct, i.e. that the clocks to the latches are active, hence the respective latches are transparent at the proper time (i.e. clock phase) with respect to the global clock 415.

With the high performance designs discussed above, the clock tree is distributed in a balanced manner through the logic. For example, in higher performance designs, the clock buffers of FIG. 4 are very tightly regulated for synthesis purposes to minimize skew, and the like. Only a specific set of clock buffers are developed for use within the design. All functional latches must be clocked directly by outputs of these clock buffers. It is illegal for functional latches to be clocked by the global clock, i.e. not by the output of a clock buffer. It is also illegal for any logic to be placed between the outputs of a clock buffer and the latches that it clocks. This set of clock buffers is developed for a specific set of purposes: their outputs represent L1 clocks versus L2 clocks (up to arbitrary Lk clocks), they are further attributed as to whether they are functional clocks versus "scan clocks" (the latter used only during scanning of the netlist, not during its functional operation), and whether they are free running versus gated clocks. Such buffers are also specially marked (or readily can be) so that synthesis and verification tools can easily locate them.

In lower performance designs, however, the clock tree is not distributed throughout the logic. Rather, clocks are driven from a central point. In lower performance designs, the global clocks may be distributed directly to latches without passing through clock buffers (in reality, the "terminal block" may not have buffers but one of its ancestors will—lower performance netlists just worry less about skew and thus, do not redistribute the clock logic to as large of a degree). There are separate global clocks of functional versus scan, but inverters or AND gates may be used to differentiate L1 versus L2 latches and free running versus gated clocks. For such designs, coloring can be performed by a counting of inversions along the clock logic (lower performance designs can be assumed to be two phase while higher phases are used only to improve performance beyond that possible with two phase netlists). Clock gates can be found by identifying AND gates along this path. Thus, the same mechanisms may be used but instead, the presence of clock buffers is inferred from the logic along the clock tree.

Thus, by obtaining the clock tree information regarding the terminal design, the clock signals sent to the latches may be identified. Based on this identification, the latches may be colored, i.e. categorized, into various classes based on their clock signals. This may be done in an automated fashion such that the burden is taken off of the circuit designer to identify which latches in the design are of which type. As a result, the possible sources of error are reduced and the speed with which design verification can be performed is increased. Utilizing such a clocking convention further makes connectivity failures, i.e. a L1 latch transitively fanning out to another L1 latch or "coloring errors" such as improper clock connectivity, significantly easier to identify. Errors detected with the present invention will not be time-consuming user errors, but instead actual errors in the design.

As shown in FIG. 4, a global clock is redistributed to each of the individual latches via clock buffers. For normal latches, the clock appearing at every latch of color "i" will be a logical one at the same time. The clock appearing at every latch of color "i+1 mod k" will be a logical one at the next time-step. Note that each latch itself is of an identical type in a level-sensitive latch-based netlist, i.e. removed from the circuit, there is nothing differentiating a L1 latch from a L2 latch. By redistributing the "global" clock to each individual latch, this clock distribution logic enforces the above rule as to when the distributed clock appearing at the individual latches will be a logical one.

Figure 5:
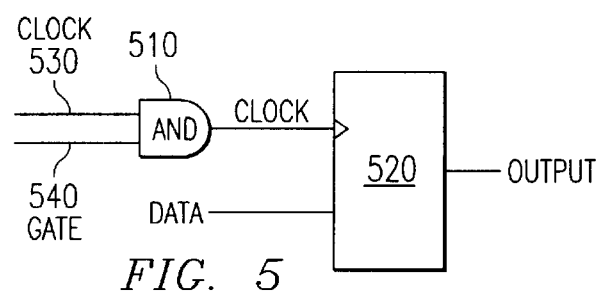
FIG. 5 is a diagram illustrating the operation of a gated-clock latch.

As previously mentioned above, not all latches may be simply categorized into L1 or L2 latches. Some latches may be gated, i.e. may have gated clocks, and thus, do not always operate strictly on an L1 or L2 latch basis depending on whether they receive a gate signal or not. Hereafter, the terms "gated-clock latch" and "gated latch" will be used interchangeably to refer to a latch that has a gated-clock input. FIG. 5 is an exemplary diagram of a gated latch to illustrate how the gated latch operates differently from a regular non-gated latch.

A gated latch may be an identical structure as a normal L1 or L2 latch. However, unlike normal latches where the clock buffers ensure that each clock will be active every k time steps, a "gate" signal is utilized, as depicted in FIG. 5, to be able to "stop the clock," i.e. to prevent the clock seen at a given gated-clock latch from being a 1 when the clock buffer of a non-gated variant of the same "color" would otherwise drive a 1 to the latch. For example, as shown in FIG. 5, an AND gate 510 exists before the latch 520. Thus, the AND gate 510 outputs a logical one on the clock signal 530 to the latch 520 only when both the clock signal 530 and the gate signal 540 are a logical 1. If only the clock signal 530 is a 1 but the gate is a logical 0, the AND gate 510 generates a "0" clock output and thus, the latch 520 holds its value since it is not transparent at the time that it ordinarily would be (i.e. during its "phase" of the clock period).

Since phase abstraction involves replacing latches with wires, which assumes that latch clocks are free-running, i.e. not gated, the functionality of the clock gate must be made explicit in order for the phase abstraction to be able to be performed accurately without introducing errors into the resulting trace output. The present invention provides an automated mechanism for identifying gated latches from the information obtained from clock tree primitives and then converting these gated latches into an explicit representation of the gated latch using only non-gated latches. This conversion is performed accurately without performing and "unsound" transformation which violates the correctness of phase abstraction, thereby invalidating any verification results obtained from the phase abstracted netlist. It should be appreciated, however, that with some embodiments of the present invention, other mechanisms, such as manual enumeration, for identifying gated-clock latches may be used without departing from the spirit and scope of the present invention.

Figure 6A:
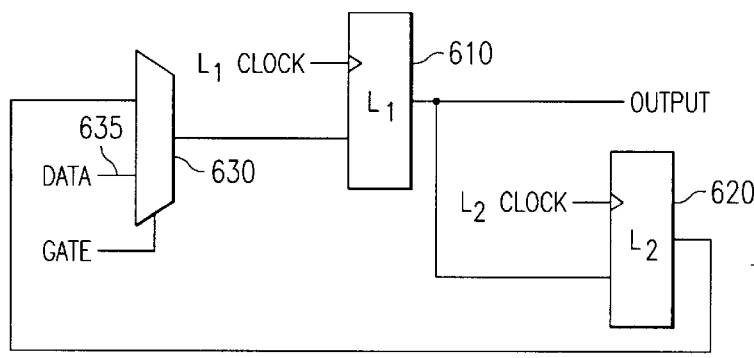
FIG. 6A is an exemplary diagram illustrating the manner by which a two phase gated-clock latch is represented in accordance with one embodiment of the present invention.

FIG. 6A is an exemplary diagram of a representation of a two-phase gated-clock latch using non-gated-clock latches in accordance with one embodiment of the present invention. As shown in FIG. 6A, this representation of the gated latch includes a first latch 610 of a same type as the gated latch and a second latch 620 of an opposite type from that of the gated latch. The second latch 620 is present in a feedback path from the first latch 610. The feedback path passes through a multiplexor 630.

With the multiplexor 630, if the gate signal is "0", then the clock to the first latch 610 is stopped so that the feedback path output is passed through the multiplexor. Otherwise, if the gate signal is not "0", then the data input 635 is passed through the multiplexor. In this way, the first latch 610, which corresponds to the gated latch, and the added second latch 620 may be driven with appropriate phase ungated clocks. Thus, traditional phase abstraction may be used on this representation of the gated latch without introducing errors into the resulting trace, e.g. circuit amnesia—the latch is unable to hold a value when its gate is shut because phase abstraction will eliminate the latch.

Figure 6B:
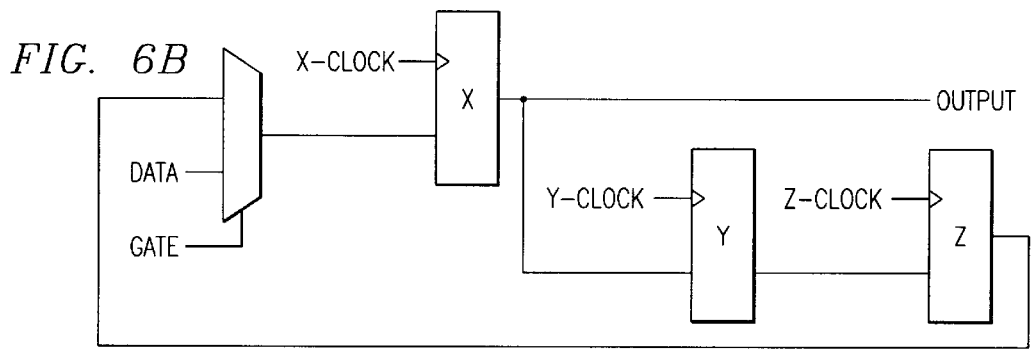
FIG. 6B is an exemplary diagram illustrating the manner by which a three phase gated-clock latch is modeled in accordance with one embodiment of the present invention.

FIG. 6B extends the representation of a gated latches from the two-phase gated latch illustrated in FIG. 6A, to a three phase gated latch. As shown in FIG. 6B, the difference between the representation of a two phase and a three phase gated latch is in the sequence of latches included in the feedback loop to the multiplexor. In both cases, a sequence of opposite type latches from that of the gated latch are included in the feedback loop. Assuming that the gated latch is of type L1, in a two phase gated latch, the latch in the feedback loop is of type L2. In a three phase gated latch, the latches in the feedback loop include a L2 and L3 type latch.

Of course this extension of the representation of a gated latch may be further extended to "k" phase gated latches. It should further be recognized that gated latches may be combined in any number of different ways and thus, the representations discussed above may also be combined. Thus, for example, if the original circuit involved a gated L1 latch coupled to a gated L2 latch, the resulting representation under the present invention would involve a representation as show in FIG. 6A coupled to a representation of a gated L2 latch.

Gated latches may be identified from the clock tree primitives, e.g., clock buffers. The clock tree primitives include information identifying whether the output of the clock buffer, for example, is gated and, if so, what the "gate" signal is. Thus, by parsing the clock tree primitive information, a determination may be made as to which latches in the circuit design are gated. Once the gated latches are identified, their functionality may be explicitly represented using non-gated latches, as described in greater detail hereafter.

In one embodiment of the present invention, an algorithm is provided for performing the conversion of a gated latch to the representation shown in FIG. 6A. The pseudocode for the algorithm that performs this conversion is as follows:

```
Determine "k" for the circuit via clock/coloring
   info
for each latch L
   if L has a gated-clock
      make_gate_explicit(L, k)
algorithm make_gate_explicit(latech_i, k) {
   // latch_i is the gated-clock register
   // k is the number of phases of the design
   cur_color = (color(latch_i) + 1) mod k;
   cur_latch = latch_i;
   while(cur_color != color(latch_i)) {
      next_latch = gat_or_create_latch(cur_color,
```

-continued

```
        cur_latch, initial_value(cur_latch));
            cur_latch = next_latch;
            cur_color = (cur_color + 1) mod k;
        }
        cur_mux = create_mux( );
        Connect_mux_select(cur_mux, clock_gate(latch_i));
        connect_mux_port_0(cur_mux, data_out(next_latch));
        connect_mux_port_1(cur_mux, data_in(latch_i));
        data_in(latch_i) = data_out(cur_mux);
    }
```

The procedure get_or_create_latch attempts to locate a latch of color "(cur_color+1) mod k" in the direct fanout of cur_latch (i.e. passing through no logic other than simple buffering), with the same initial_value as that of cur_latch. If no such latch exists, then this procedure creates such a latch with an ungated clock, driven directly by cur_latch. This process is iterated to create (or find) a topologically-correct feedback path to the current latch. The process then creates a multiplexor in front of latch_i. This multiplexor is selected by the clock gate. If the clock gate is inactive, then this created (or discovered) feedback path is sensitized. If the clock gate is active, then the data_in of latch_i is sensitized. The output of the multiplexor is then connected to the data_in of latch_i. This procedure makes the clock gate explicit. That is, after being applied to all gated clocks, simple phase abstraction can be applied and semantics will not be violated as they would otherwise in presence of gated-clock latches.

Thus, the present invention provides mechanisms for automatically coloring latches in a circuit design such that the burden of specifying which latches are of which type is shifted from the human designer to the automated mechanisms. These mechanisms further include an automated methodology for identifying and representing gated latches such that the phase abstraction applied to the gated latches will not result in erroneous information in the resulting trace. These mechanisms may be used in conjunction with one another or separate from one another with known phase abstraction tools.

Once the latches in a circuit design are colored into their respective categories, phase abstraction may be applied to them. As previously mentioned, phase abstraction involves replacing all but one class of latches with wires and replacing the remaining class with an edge sensitive element, e.g., a register. Once this replacement is done, verification of the modified circuit design is performed to identify whether there are any operational inconsistencies between the designer's intention for the circuit and its actual behavior.

Typically, however, when a trace is obtained after having performed phase abstraction, the resulting phase-abstracted trace does not resemble a trace of the circuit design that would be obtained without phase abstraction. That is, the resulting trace includes effects from the phase abstraction that make it difficult and/or time consuming for a human designer to convert into a trace of a non-phase abstracted circuit design. The present invention provides a mechanism by which the effects of phase abstraction may be removed from a phase abstracted trace to thereby, automatically generate a non-phase abstracted trace for use by circuit designers in verifying the operation of their circuit designs.

Figure 7:
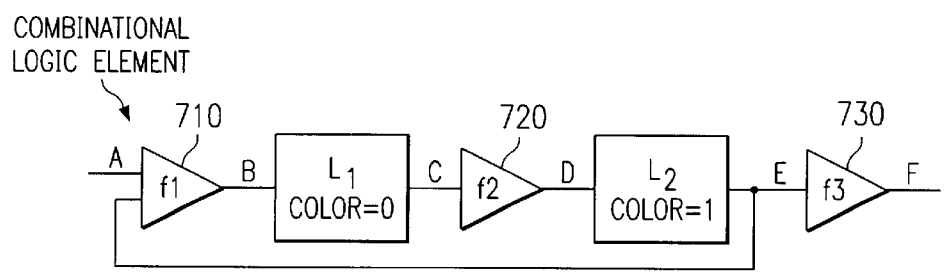
FIG. 7 is an exemplary diagram of a two-phase circuit design for illustrating the manner by which the present invention removes effects of phase abstraction from a phase-abstracted trace.

FIG. 7 is an exemplary diagram of a circuit design for illustrating the manner by which the present invention removes the effects of phase abstraction from the phase abstracted trace. As shown in FIG. 7, the two-phase circuit design includes combinational logic elements 710, 720 and 730. The combinational logic element 710 performs a function "f1" on received data signals to generate an output signal. Similarly, combinational logic elements 720 and 730 perform functions "f2" and "f3", respectively, on their input data signals to generate output signals.

Between combinational logic elements 710 and 720 is a first latch $L_1$ having a color 0. Between combinational logic elements 720 and 730 is a second latch $L_2$ having a color 1. The signals along the wires between elements are denoted A, B, C, D, E and F. A feedback loop from the output of latch $L_2$ to an input of combinational logic 710 is also provided.

An un-phase-abstracted trace of the circuit design shown in FIG. 7 is shown in Table 1 below:

TABLE 1

| | Unabstracted Trace of FIG. 7 | | | |
|---|---|---|---|---|
| Clock | L1 | L2 | L1 | L2 |
| A | a | a' | b | b' |
| B | f1(a,$L2_0$) | f1(a',a) | f1(b,a) | f1(b',f2(f1(b,a))) |
| C | f1(a,$L2_0$) | f1(b,$L2_0$) | f1(b,a) | f1(b,a) |
| D | a | a | f2(f1(b,a)) | f2(f1(b,a)) |
| E | $L2_0$ | a | a | f2(f1(b,a)) |
| F | f3($L2_0$) | f3(a) | f3(a) | f3(f2(f1(b,a))) |

In the above table, a, a', b and b' are arbitrarily defined input values to the circuit design at the various clock timings. In addition, $\alpha$ is defined as $f2(f1(a,L2_0))$ where $L2_0$ is the initial value of latch L2. While the above table illustrates the various data values input/output along lines A–F as symbolic values over arbitrary input values a, a', b, b'..., in actuality the trace would be a plurality of 0's and 1's indicating the data values at different times during the trace when filling in a 0 or a 1 value for each input value a, a', etc.

In one exemplary embodiment, in order to remove the effects of phase abstraction in a phase abstracted trace, a linear-time algorithm may be used to perform this transformation from phase abstracted trace to non-phase abstracted trace.

During phase abstraction, a list of all signal names of each color is generated. In other words, the nets of the circuit are colored as follows:

(1) all nets combinationally driven by latches of color "i" also have color "i";

(2) all nets combinationally driving data_in of latches of color "i" have color "(i−1) mod k";

(3) all nets in combinational cones of color "i" also have color "i"; and (4) all non-clock nets (see below) not colored by the above can default to color 0.

In addition clock nets (which are in the fanin of ungated latch clocks) are specially colored since these will be eliminated from the trace. The coloring algorithm used for clock nets sweeps fanin-wise through combinational and sequential logic, beginning from all clock inputs of latches (since clock logic may contain sequential elements).

In deciding which signals to add into the un-phase-abstracted trace, it is important to preserve the values of the functional logic in the trace but to strip out the clock tree logic since phase abstraction will destroy its semantics. Verification of the clock logic is a much simpler process than functional verification in general. Therefore, partitioning the overall verification tasks is quite worthwhile. In other words, it may be assumed that the clock logic is correct when verifying functionality, and the clock logic may be verified separately. It should be noted that the functional gate of gated-clock latches will be propagated.

Figure 8A:
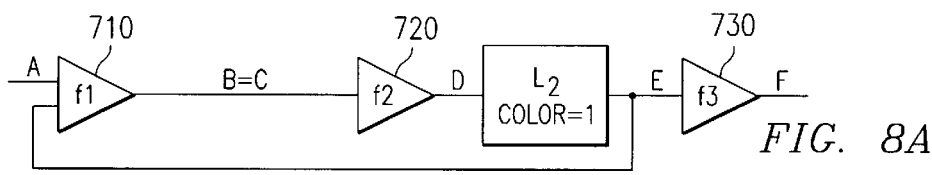
FIG. 8A illustrates the circuit design of FIG. 7 following phase abstraction in which latches of a first color are preserved.
Figure 8B:
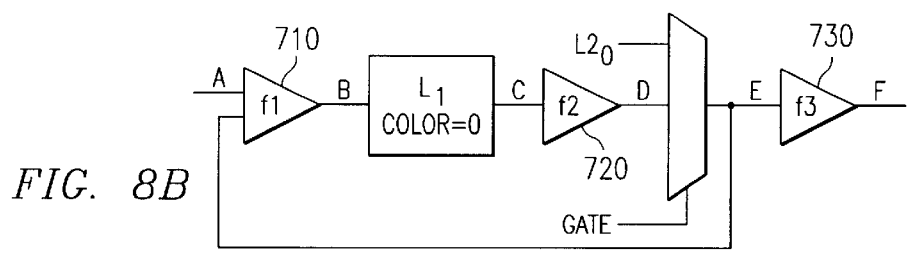
FIG. 8B illustrates the circuit design of FIG. 7 following phase abstraction in which latches of a second color are preserved.

In a two-phase circuit design, phase abstraction may be performed in two different ways. That is, elements of color 0 may be preserved or elements of color 1 may be preserved. FIGS. 8A and 8B illustrate these two methods of phase abstraction. Of course, in higher phase circuits, i.e. three phase circuits and higher, additional ways to perform the phase abstraction are possible. The methodology of the present invention may be extended to any k-phase circuit design.

FIG. 8A illustrates the circuit design of FIG. 7 when phase abstraction is performed such that color 1 elements are preserved. As shown in FIG. 8A, since color 1 elements are preserved, the latch $L_1$, is replaced by a wire, i.e. is made transparent. A phase-abstracted trace of the resulting circuit design shown in FIG. 8A is provided in Table 2 below:

TABLE 2

| Phase Abstraction 1 (FIG. 8A) | | | | |
|---|---|---|---|---|
| Clock | T | T | color | δ |
| A | a | b | 1 | 0 |
| B | f1(a,$L2_0$) | f1(b,a) | 1 | 0 |
| C | f1(a,$L2_0$) | f1(b,a) | 0 | 2 |
| D | a | f2(f1(b,a)) | 0 | 2 |
| E | $L2_0$ | a | 1 | 0 |
| F | f3($L2_0$) | f3(a) | 1 | 0 |

In the above table, each column of the trace represents an entire clock period T, a and b are arbitrarily defined input values to the circuit design and α is defined as f2(f1(a,$L2_0$)) where $L2_0$ is the initial value of latch L2.

The "color" column identifies the color of the data signal, as identified by the color of the combinational logic elements and preserved latches. The mechanisms for coloring elements of a circuit design, and thus the data signals in the circuit design, have been discussed previously.

The δ column represents a delay in the trace data. In other words, the δ value represents the amount of shifting in the trace data that is necessary to remove the effects of the phase abstraction in the resulting trace. For nets v, the δ value is defined as k (for a two phase circuit design, k is 2) only if the color of the data signal, i.e. color(v), is less than the color of the latches preserved by the phase abstraction; otherwise the value for δ is 0. Presented a different way, the δ value is 0 if color(v) is k−1 or if latches of color 0 to color(v) are preserved; otherwise, the value of δ is k.

FIG. 8B illustrates the circuit design of FIG. 7 when phase abstraction is performed such that color 0 elements are preserved. As shown in FIG. 8B, since color 0 elements are preserved, the latch $L_2$, is replaced by a multiplexor. A phase-abstracted trace of the resulting circuit design shown in FIG. 8A is provided in Table 3 below:

TABLE 3

| Phase Abstraction 2 (FIG. 8B) | | | | |
|---|---|---|---|---|
| Clock | T | T | color | δ |
| A | a | b | 1 | 0 |
| B | f1(a,$L2_0$) | f1(b,a) | 1 | 0 |
| C | $L1_0$ | F1(a,$L2_0$) | 0 | 0 |
| D | f2($L1_0$) | a | 0 | 0 |

TABLE 3-continued

| Phase Abstraction 2 (FIG. 8B) | | | | |
|---|---|---|---|---|
| Clock | T | T | color | δ |
| E | $L2_0$ | a | 1 | 0 |
| F | f3($L2_0$) | f3(a) | 1 | 0 |

Whether the phase abstraction from FIG. 8A or FIG. 8B is utilized, the present invention performs functions designed to remove the effects of the phase abstraction. Because phase abstraction essentially collapses the time periods in the trace, in order to remove the effects of phase abstraction, the time periods must be expanded. In order to do this, the data signal values at various timings during the trace must be recreated from the phase abstracted trace.

The present invention recreates these data signal values by replicating the data signal values shown in the phase abstracted trace at determined time intervals in the un-phase-abstracted trace. In other words, the values of net v at time i from the phase abstracted trace are applied to chosen time steps i' of the un-phase-abstracted trace. These time steps i' are chosen based on the following relationship:

$$\text{times } i'=[k^*(i-1)+\text{color}(v)+\delta(v), \ldots, k^* (i)+\text{color}(v)-1+\delta(v)]$$

as long as: i'≥0 (no negative time steps); and
[color(v)=k−1 or i'≥color(v)] (used to prevent replication of initial values of an "artifact latch."

An "artifact latch" is any latch of color<k−1. They are referred to as "artifacts" since they will cause the phase-abstracted trace to illustrate initial values that do not appear in the un-phase-abstracted trace.

Thus, the present invention generates an un-phase-abstracted trace from a phase-abstracted trace by replicating the data signal values at times defined by the relationship above. In so doing, a trace similar to that shown in Table 1 is generated. This allows a user of the present invention who expects to see a trace in terms of the actual circuit design, rather than a phase-abstracted circuit, to receive an un-phase-abstracted trace even though phase abstraction was used during the verification of the circuit design. Thus, the benefits of phase abstraction are obtained while eliminating the negative effects of having the user interpret the phase abstracted trace in terms of an un-phase-abstracted trace.

Figure 9:
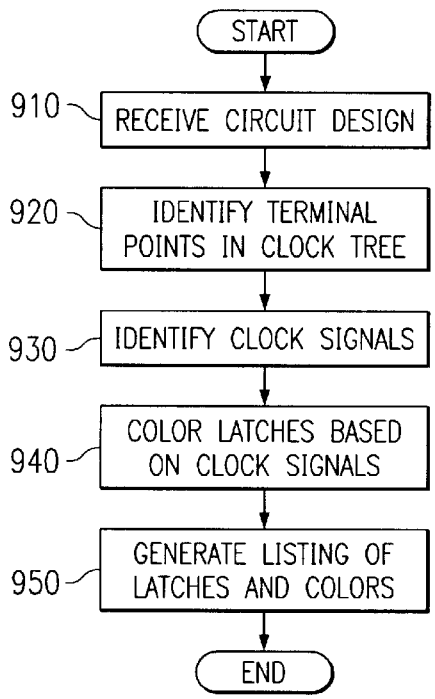
FIG. 9 is a flowchart outlining an exemplary operation of the present invention when coloring latches in a circuit design.

FIG. 9 is a flowchart outlining an exemplary operation for coloring latches in a circuit design in accordance with the present invention. As shown in FIG. 9, the operation starts with receiving a circuit design (step 910). The terminal points at the output of the clock buffers in the clock tree corresponding to the circuit design are identified (step 920). Since a list of all types of clock buffers is available from the circuit design, e.g., from the netlist, the important portions of the clock tree can be identified.

From the clock tree, the clock signals that activate the various latches in the circuit design are identified (step 930). The corresponding latches are then colored based on the type of clock signal that activates the latch (step 940). A listing of latches and their corresponding colors is then generated (step 950) and the operation ends.

Figure 10:
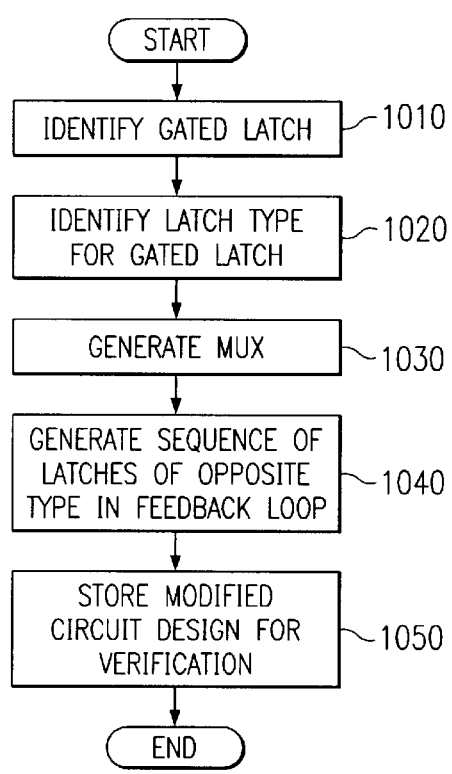
FIG. 10 is a flowchart outlining an exemplary operation of the present invention to explicitly represent gated latches.

FIG. 10 is a flowchart outlining an exemplary operation of the present invention when converting a gated-clock latch into an explicit representation of the gated latch using non-gated latches. As shown in FIG. 10, the operation starts with the identification of a gated latch from clock tree information for the circuit design (step 1010). The latch type, e.g., L1 or L2, for the gated latch is identified (step 1020). The gate is removed and a multiplexor having the gate signal and a data_in signal as inputs is created before the gated latch (step 1030). The gate signal acts a selector signal wherein the data_in signal is selected in a "gate open" state and the feedback path is selected in a "gate closed" state. A sequence of latches of opposite type from that of the gated latch are generated along the feedback loop (step 1040). The resulting modified circuit design is then stored for use in the phase abstraction (step 1050) and the operation ends. This process may be repeated for each gated latch identified in the clock tree.

Figure 11:
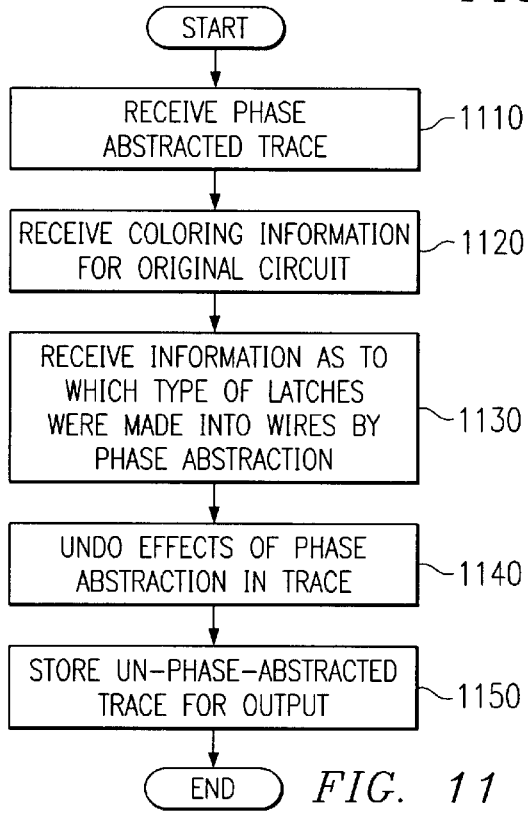
FIG. 11 is a flowchart outlining an exemplary operation of the present invention for removing the effects of phase abstraction for a phase-abstracted trace.

FIG. 11 is a flowchart outlining an exemplary operation of the present invention when removing the effects of phase abstraction from a phase abstracted trace. As shown in FIG. 11, the operation starts with receiving a phase abstracted trace (step 1110). Coloring information for the original circuit is received (step 1120). Information as to which type of latches were made into wires by phase abstraction is also received (step 1130). The effects of the phase abstraction in the trace are then undone (step 1140) and the un-phase-abstracted trace is stored for later output (step 1150).

The mechanisms described in FIGS. 9–11 may be employed separately or in any combination to obtain the various benefits indicated above with regard to each mechanism. That is, the automated coloring of latches, representation of gated latches as non-gated latches, and removal of phase abstraction effects from a phase-abstracted trace, may each be used individually or with one or more of the other mechanisms. In a preferred embodiment, to obtain maximum benefit from the above mechanisms, all three are combined into an overall automated method of verification of a circuit design using phase abstraction.

FIG. 12 if a flowchart illustrating a combined methodology for verification of a circuit design using phase abstraction in accordance with a preferred embodiment of the present invention. As shown in FIG. 12, the operation starts with the receipt of a circuit design (step 1210). Then, the latch clocks are taxonomized (step 1220). Gated latches in the circuit design are identified and explicitly represented as non-gated latches (step 1230). The latches in the modified circuit design are colored based on the information obtained from the clock tree (step 1240).

Phase abstraction is then performed on the colored circuit design (step 1250). For example, for a k-phase netlist, the netlist can be phase abstracted to k different "preserve-color-i-latches." If color "k−1" latches are preserved, the remaining latches are replaced by wires. If color "j!=k−1" is preserved, color "k−1" latches are eliminated (and maybe others if k!=2), so that another mulitplexor is introduced to preserve the initial values of the color k−1 latches. This multiplexor is selected by a new signal "f" that is created such that it is 1 at time 0, and thereafter it is a 0 for any time i>0. The "selector is 0" input is the original L2 input (or L "k−1" input). The "selector is 1" input is connected to the initial value of the removed L "k−1" latch. Note that which phase was preserved is now part of the un-phase-abstracting of trace code.

The phase abstracted circuit design is then verified, e.g., using a verification tool (step 1260). Pass/Fail information and the resulting trace are received from the verification tool (step 1270). The phase abstracted trace is then processed to remove the effects of the phase abstraction (step 1280).

FIG. 13 is an exemplary block diagram of the primary elements of an automated design verification apparatus according to the present invention. The elements shown in FIG. 13 may be implemented in hardware, software, or any combination of hardware and software without departing from the spirit and scope of the present invention. In a preferred embodiment, the elements shown in FIG. 13 are implemented as software instructions implemented in one or more hardware devices.

As shown in FIG. 13, the automated design verification apparatus includes a controller 1310, a user interface 1320, a design storage device 1330, a circuit element coloring module 1340, a phase abstraction module 1350, a phase-abstracted trace conversion module 1360, and a trace output device 1370. The elements 1310–1370 are coupled to one another via the control/data signal bus 1380. Although a bus architecture is shown in FIG. 13, the present invention is not limited to such and any architecture that facilitates the communication of control/data signals between the elements 1310–1370 may be used without departing from the spirit and scope of the present invention.

Furthermore, while FIG. 13 depicts the elements 1310–1370 as being integrated into the same physical device, the present invention is not limited to such an embodiment. Rather, one or more of the elements 1310–1370 may be remotely located from one or more of the other elements such that a distributed processing environment is obtained. In such an embodiment, the elements 1310–1370 that are remotely located may be in communication with the other elements 1310–1370 via one or more networks or other communication links.

The controller 1310 is responsible for controlling the overall operation of the automated design verification apparatus and for orchestrating the operation of the other elements 1320–1370. The controller 1310 receives input from a human designer via the user interface 1320. The user may enter a circuit design or the like, and store this circuit design in the design storage device 1330. In response to commands from the user, the controller 1310 may instruct the element coloring module 1340, phase abstraction module 1350, and phase-abstracted trace conversion module 1360, to operate in order to perform a verification of the circuit design stored in the design storage device 1330.

In response to instructions from the controller 1310, the element coloring module 1340 performs analysis on a clock tree of the circuit design to thereby color the various latches in the circuit design, as previously described above. This coloring of the latches may include representing gated latches as non-gated latches. The colored circuit design may then be input to the phase abstraction module 1350 which performs phase abstraction on the colored circuit design and performs a trace of the circuit operation. The resulting phase-abstracted trace is then input to the phase-abstracted trace conversion module 1360 which processes the phase-abstracted trace to remove the effects of phase abstraction.

Thus, the present invention provides an apparatus and method for automatically coloring latches, both gated and non-gated latches, in a circuit design based on clock tree information. The present invention further provides an apparatus and method for verifying a circuit design using phase abstraction in which the phase abstracted trace is processed to remove the effects of the phase abstraction. In this way, the burden of performing the circuit verification on the human designer is lessened, the speed with which the verification can be performed is increased, and the accuracy of the trace is increased.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMS, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of verifying a circuit design having at least one gated-clock latch, comprising:

receiving a clock tree for the circuit design;

identifying the at least one gated-clock latch based on information obtained from the clock tree;

replacing the at least one gated-clock latch with an explicit representation of a functionality of the gated-clock latch to thereby generate a modified circuit design;

performing phase abstraction on the modified circuit design; and verifying the circuit design based on the phase abstraction of the modified circuit design.

2. The method of claim 1, wherein the explicit representation of the functionality of the at least one gated-clock latch is a representation comprising non-gated-clock latches.

3. The method of claim 1, further comprising:

coloring latches in the circuit design, wherein replacing the at least one gated-clock latch with an explicit representation of a functionality of the at least one gated-clock latch includes replacing the at least one gated-clock latch with a sequence of non-gated latches based on the color of the at least one gated-clock latch.

4. The method of claim 3, wherein replacing the at least one gated-clock latch further includes providing, in the explicit representation of the functionality of the at least one gated-clock latch, a multiplexor having a gate signal as an input.

5. The method of claim 1, wherein replacing the at least one gated-clock latch includes:

identifying a color of the at least one gated-clock latch;

replacing the at least one gated-clock latch with a multplexor and a non-gated clock latch of a same color as the gated-clock latch; and placing a sequence of one or more latches of different color from the color of the at least one gated-clock latch in a feedback loop from the non-gated clock latch to the multiplexor.

6. The method of claim 1, wherein verifying the phase abstracted circuit design includes obtaining a phase-abstracted trace of the circuit design.

7. The method of claim 6, further comprising:

removing effects of phase abstraction from the phase-abstracted trace.

8. The method of claim 7, wherein removing effects of phase abstraction from the phase-abstracted trace includes:

receiving coloring information for the elements of the circuit design;

receiving phase abstraction information identifying which color elements were preserved during the phase abstraction; and removing effects of phase abstraction from the phase-abstracted trace based on the coloring information and the phase abstraction information.

9. The method of claim 8, wherein removing effects of phase abstraction includes:

replicating signal values in the phase-abstracted trace at determined timesteps.

10. The method of claim 9, wherein the timesteps are determined based on the following relation:

$$i'=[k*(i-1)+\text{color}(v)+\delta(v), \ldots, k*(i)+\text{color}(v)-1+\delta(v)]$$

where i' is a set of timesteps, i is a timestep, k is the number of phases in the circuit design, v is a net in a netlist of the circuit design, color(v) is the color of the net v, and $\delta(v)$ is a delay value associated with the net.

11. The method of claim 10, wherein a value of $\delta(v)$ is k only if a color of a circuit element preserved by phase abstraction is greater than color(v), otherwise the value of $\delta(v)$ is 0.

12. The method of claim 7, further comprising:

generating an un-phase-abstracted trace based on the removing of the effects of phase abstraction from the phase-abstracted trace.

13. A computer program product in a computer readable medium for verifying a circuit design having at least one gated-clock latch, comprising:

first instructions for receiving a clock tree for the circuit design;

second instructions for identifying the at least one gated-clock latch based on information obtained from the clock tree;

third instructions for replacing the at least one gated-clock latch with an explicit representation of a functionality of the gated-clock latch to thereby generate a modified circuit design;

fourth instructions for performing phase abstraction on the modified circuit design; and fifth instructions for verifying the circuit design based on the phase abstraction of the modified circuit design.

14. The computer program product of claim 13, wherein the explicit representation of the functionality of the at least one gated-clock latch is a representation comprising non-gated-clock latches.

15. The computer program product of claim 13, further comprising:

sixth instructions for coloring latches in the circuit design, wherein the third instructions for replacing the at least one gated-clock latch with an explicit representation of a functionality of the at least one gated-clock latch include instructions for replacing the at least one gated-clock latch with a sequence of non-gated latches based on the color of the at least one gated-clock latch.

16. The computer program product of claim 15, wherein the instructions for replacing the at least one gated-clock latch further include instructions for providing, in the explicit representation of the functionality of the at least one gated-clock latch, a multiplexor having a gate signal as an input.

17. The computer program product of claim 13, wherein the third instructions for replacing the at least one gated-clock latch include:

instructions for identifying a color of the at least one gated-clock latch;

instructions for replacing the at least one gated-clock latch with a multplexor and a non-gated clock latch of a same color as the gated-clock latch; and instructions for placing a sequence of one or more latches of different color from the color of the at least one gated-clock latch in a feedback loop from the non-gated clock latch to the multiplexor.

18. The computer program product of claim 13, wherein the fifth instructions for verifying the phase abstracted circuit design include instructions for obtaining a phase-abstracted trace of the circuit design.

19. The computer program product of claim 18, further comprising:

sixth instructions for removing effects of phase abstraction from the phase-abstracted trace.

20. The computer program product of claim 19, wherein the sixth instructions for removing effects of phase abstraction from the phase-abstracted trace include:

instructions for receiving coloring information for elements of the circuit design;

instructions for receiving phase abstraction information identifying which color elements were preserved during the phase abstraction; and instructions for removing effects of phase abstraction from the phase-abstracted trace based on the coloring information and the phase abstraction information.

21. The computer program product of claim 19, wherein the sixth instructions for removing effects of phase abstraction includes:

instructions for replicating signal values in the phase-abstracted trace at determined timesteps.

22. The computer program product of claim 21, wherein the timesteps are determined based on the following relation:

$$i'=[k*(i-1)+\text{color}(v)+\delta(v), \ldots, k*(i)+\text{color}(v)-1+\delta(v)]$$

where i' is a set of timesteps, i is a timestep, k is the number of phases in the circuit design, v is a net in a netlist of the circuit design, color(v) is the color of the net v, and $\delta(v)$ is a delay value associated with the net.

23. The computer program product of claim 22, wherein a value of $\delta(v)$ is k only if a color of a circuit element preserved by phase abstraction is greater than color(v), otherwise the value of $\delta(v)$ is 0.

24. The computer program product of claim 19, further comprising:

seventh instructions for generating an un-phase-abstracted trace based on the removing of the effects of phase abstraction from the phase-abstracted trace.

25. An apparatus for verifying a circuit design having at least one gated-clock latch, comprising:

means for receiving a clock tree for the circuit design;

means for identifying the at least one gated-clock latch based on information obtained from the clock tree;

means for replacing the at least one gated-clock latch with an explicit representation of a functionality of the gated-clock latch to thereby generate a modified circuit design;

means for performing phase abstraction on the modified circuit design; and means for verifying the circuit design based on the phase abstraction of the modified circuit design.

26. The apparatus of claim 25, wherein the explicit representation of the functionality of the at least one gated-clock latch is a representation comprising non-gated-clock latches.

27. The apparatus of claim 25, further comprising:

means for coloring latches in the circuit design, wherein the means for replacing the at least one gated-clock latch with an explicit representation of a functionality of the at least one gated-clock latch includes means for replacing the at least one gated-clock latch with a sequence of non-gated latches based on the color of the at least one gated-clock latch.

28. The apparatus of claim 25, wherein the means for replacing the at least one gated-clock latch includes:

means for identifying a color of the at least one gated-clock latch;

means for replacing the at least one gated-clock latch with a multplexor and a non-gated clock latch of a same color as the gated-clock latch; and means for placing a sequence of one or more latches of different color from the color of the at least one gated-clock latch in a feedback loop from the non-gated clock latch to the multiplexor.

29. The apparatus of claim 25, wherein the means for verifying the phase abstracted circuit design includes means for obtaining a phase-abstracted trace of the circuit design.

* * * * *